(12) United States Patent
Kim et al.

(10) Patent No.: US 8,916,765 B2
(45) Date of Patent: Dec. 23, 2014

(54) 3-D SOLA CELL DEVICE FOR A CONCENTRATED PHOTOVOLTAIC SYSTEM

(71) Applicants: Gerald Ho Kim, Carlsbad, CA (US); Jay Eunjae Kim, Issaquah, WA (US)

(72) Inventors: Gerald Ho Kim, Carlsbad, CA (US); Jay Eunjae Kim, Issaquah, WA (US)

( * ) Notice: Subject to any disclaimer, the term of this patent is extended or adjusted under 35 U.S.C. 154(b) by 96 days.

(21) Appl. No.: 13/844,724

(22) Filed: Mar. 15, 2013

(65) Prior Publication Data

US 2014/0261623 A1 Sep. 18, 2014

(51) Int. Cl.
*H01L 31/052* (2014.01)
*H01L 31/042* (2014.01)

(52) U.S. Cl.
CPC .................................. *H01L 31/042* (2013.01)
USPC .......................................... 136/246; 136/259

(58) Field of Classification Search
USPC ................................................. 136/246, 259
See application file for complete search history.

(56) References Cited

U.S. PATENT DOCUMENTS

| | | | | |
|---|---|---|---|---|
| 3,232,795 A * | 2/1966 | Snyder et al. | ................ | 136/246 |
| 3,427,200 A * | 2/1969 | Ernest et al. | ................ | 136/246 |
| 4,045,246 A * | 8/1977 | Mlavsky et al. | ............. | 136/246 |
| 4,134,387 A * | 1/1979 | Tornstrom | ................... | 126/684 |
| 4,430,519 A * | 2/1984 | Young | ........................... | 136/244 |
| 4,836,861 A * | 6/1989 | Peltzer et al. | ................ | 136/246 |
| 5,118,361 A * | 6/1992 | Fraas et al. | .................. | 136/246 |
| 5,123,968 A * | 6/1992 | Fraas et al. | .................. | 136/246 |
| 5,538,563 A * | 7/1996 | Finkl | ............................ | 136/246 |
| 6,051,776 A * | 4/2000 | Kimata et al. | ................ | 136/246 |
| 6,177,627 B1 * | 1/2001 | Murphy et al. | .............. | 136/246 |
| 6,528,716 B2 * | 3/2003 | Collette et al. | ............... | 136/246 |
| 2003/0155003 A1 * | 8/2003 | Tur et al. | ..................... | 136/246 |

* cited by examiner

*Primary Examiner* — Golam Mowla

(57) ABSTRACT

A low cost design for a concentrated photovoltaic (CPV) solar cell device is developed with a 3-D solar cell structure that eliminates the need for sun-ray tracking and with improved electricity conversion efficiency for cooling solar cells. The 3-D solar cell structure can be built with conventional monocrystalline or polycrystalline silicon or with multi-junction III-V solar material, joining two or more solar cell segments perpendicular to a base solar cell. This structure is able to collect all incident sunlight from sunrise to sunset.

23 Claims, 12 Drawing Sheets

3-D SOLA CELL DEVICE FOR A CONCENTRATED PHOTOVOLTAIC SYSTEM

BACKGROUND

1. Technical Field

The present disclosure relates to a concentrated photovoltaic device that is capable of generating thermal and electrical energy from solar radiation using a three-dimensional (3-D) solar cell design structure with no need for a sun-tracking system.

2. Description of the Related Art

The concentrated photovoltaic (CPV) solar cell design's use of silicon material brings about the advantages of overall cost reduction and power conversion efficiency. Many CPV solar cell systems use highly efficient monocrystalline or polycrystalline silicon solar cells with a light collecting lens such as Fresnel lens, a plastic convex lens, or a lens duct. These lenses focus solar radiation into the solar cell to generate electricity. The current problem with CPV solar designs, however, is that the solar cell has to face the solar rays directly to generate adequate amounts of electricity. As a result, many current designs have incorporated a tracking system which follows the Sun to maximize the conversion efficiency. Typically, the tracking system is a relatively expensive component. Furthermore, its mechanical nature makes it an implicitly unreliable component over many years of continuous operation. A novel three-dimensional solar cell structure removes the need for a tracking system and allows for the collection of all solar rays without the need to track the movement of the Sun. This design will improve long term reliability and reduce the total system cost.

In the case of CPV design, the solar cell has to maintain a certain temperature range to maintain the optimum electrical conversion efficiency. The cooling of the CPV design is another important factor in achieving long term reliability of the solar cell and maximum energy efficiency. Currently, many designs have been developed with a heat-fin or other structure mounted to the solar cell frame to cool the solar cell to a certain temperature; without such structures, the solar cell performance would be degraded when the solar cell exceeds a certain temperature threshold. In this invention, we have designed a liquid cooling scheme for the 3-D solar cell to maintain an optimal operating temperature for the CPV solar cell. In addition, the thermal solar energy coming from the liquid cooling is recycled to heat a hot-water tank.

The captured solar energy can be converted into both electricity and thermal energy. The shorter wavelengths of the solar spectrum (e.g. ultra-violet) can be converted into electricity while the longer wavelengths (e.g., infrared) can be converted into thermal energy. Because the thermal energy is also absorbed into the solar cell, a large heat sink is often used to cool off the solar cell in CPV designs and the solar cell loses its efficiency as the temperature rises beyond a certain threshold. This invention will utilize not only the shorter wavelength to generate electricity but also extract and store the thermal energy generated by the longer wavelengths into a hot-water reservoir. This scheme will improve the solar energy conversion efficiency of the CPV solar cell design to the highest conversion efficiency by utilizing both electrical and thermal energy derived from the incident solar energy.

SUMMARY

Various embodiments of a concentrated photovoltaic device that is capable of generating thermal and electrical energy from solar radiation using a 3-D solar cell design structure with no need for a sun-tracking system are described herein. The 3-D solar cell structure uses liquid cooling to provide maximum energy utilization from both stored thermal and electrical solar energy.

A low cost design for a concentrated photovoltaic (CPV) solar cell device is developed with a 3-D solar cell structure that eliminates the need for sun-ray tracking and with improved electricity conversion efficiency for cooling solar cells. The 3-D solar cell structure can be built with conventional monocrystalline or polycrystalline silicon or with multi-junction III-V solar material, joining two or more solar cell segments perpendicular to a base solar cell. This structure is able to collect all incident sunlight from sunrise to sunset. Since the CPV solar cell system collects a large area of solar power into a small solar cell footprint, the design incorporates liquid cooling on the back side of the solar cell. The effective cooling of the solar cell will increase the electricity conversion efficiency and the three-dimensional solar cell structure permits the collection of all incident sunlight without the need to track the sun's position. The design also uses the spent cooling liquid as a source of thermal energy for generating hot-water. By collecting both thermal and electrical energy, the 3-D solar cell design can maximize the total solar energy conversion.

The concentrated photovoltaic solar cell device has a focusing lens element that focuses all solar energy into a 3-D solar cell structure with a liquid cooling feature on the backside. The 3-D construction of the solar cell eliminates the needs of mounting a tracking system since the 3-D solar cell structure captures all sunlight throughout the day.

In this invention, 3-D solar cells are designed with liquid channels made from Silicon MEMS etching or an RIE process. Most of the solar cells are made from silicon or III-V semiconductor material and these bulk materials can be chemically or plasma etched to form a micro- or macro-liquid channel that can be used for cooling very hot surfaces. The surfaces of all 3-D solar cells are cooled by liquid transported through the channels.

The most unique feature of the 3-D solar cell device is that it captures all sunlight from any latitudinal or longitudinal change in solar position without moving the 3-D solar cell device. Most current CPV solar cell systems move their focusing lens to face directly to sunlight so the solar focus can be projected onto a solar cell. The new 3-D solar cell device solves the tracking problem of solar movement by building a special 3-D solar cell structure. A 2-D solar cell structure has a solar cell laid on a flat surface and a tracking system moves the solar cell normal to the incident sunlight; however, the 3-D solar cell structure adds to the 2-D solar cell structure in the out-of-the-plane direction to capture all sunlight that is not normal to the solar cell structure. The 3-D solar cell structure eliminates the needs of solar tracking system to improve reliability and lower production cost.

Another feature of the 3-D solar cell structure is that it can be designed with a corner-cube configuration to compensate for all latitudinal and longitudinal changes due to seasonal and daily solar movements. The corner-cube configuration has the advantage of collecting sunlight from impinging on any angle and the out-of-the plane solar cell is highly effective at collecting sunlight during the sunrise and sunset periods. All 3-D solar cell devices are incorporated with a liquid cooling channel at the back of the solar cells so maximum solar intensity can be used for generating solar electricity.

The new CPV solar cell system combining the special 3-D solar cell structure and liquid cooling can achieve high solar energy efficiency and lower manufacturing costs. The CPV solar cell system is designed to deliver a lower cost system with maximum solar energy conversion efficiency since the liquid cooling keeps the operating temperature of the solar cell at reasonable levels. The cooling liquid of the 3-D solar cell device can be recycled to warm up a hot-water tank in a household. Once the liquid warms from the active 3-D solar cell device, the liquid is circulated to a heat-exchanger for cooling down by cold water. The cold water heats up and the water temperature in the hot-water tank rises as it accumulate the converted solar thermal energy. The hot water in the tank can be used for a variety of household uses, including heating and washing.

In one aspect, a 3-D solar cell device that collects sunlight from various sun positions comprises: a base solar cell chip having a primary surface and a backside surface opposite to the primary surface, the primary surface having at least one groove thereon; and a vertical solar cell chip comprising two solar cell chips bonded together to form a double sided solar cell, wherein each of a first surface and a second surface of the vertical solar cell chip are n-type regions of the 3-D solar cell device, the second surface of the vertical solar cell chip being opposite to the first surface of the vertical solar cell chip, wherein the vertical solar cell chip is received in one of the at least one groove of the base solar cell chip to form a vertical plane with respect to a horizontal plane formed by the primary surface of the base solar cell chip.

In one embodiment, the base solar cell chip comprises a monocrystalline silicon substrate.

In one embodiment, the base solar cell chip comprises a multi-junction III-V solar cell material.

In one embodiment, the at least one groove comprises a V-groove or a rectangular channel.

In one embodiment, the vertical solar cell chip comprises a monocrystalline silicon substrate.

In one embodiment, the vertical solar cell chip comprises a multi-junction III-V solar cell material.

In one embodiment, the base solar cell chip is at least twice longer than the vertical solar cell chip in one dimension.

In one embodiment, the vertical solar cell chip is bonded orthogonally to the base solar cell chip.

In one embodiment, the primary surface of the base solar cell chip and the first surface of the vertical solar cell chip are electrically connected to form an n-type region in the 3-D solar cell device.

In one embodiment, the backside surface of the base solar cell chip and the second surface of the vertical solar chip are electrically connected to form a p-type region of the 3-D solar cell device.

In one embodiment, the 3-D solar cell device further comprises a block bonded to the backside surface of the base solar cell chip.

In one embodiment, the block comprises a metal heat-sink structure with a liquid cooling channel on or in the block.

In one embodiment, the vertical solar cell chip is bonded to one of the at least one groove of the base solar cell chip by diffusion bonding, solder bonding, or epoxy bonding.

In another aspect, a 3-D solar cell device that collects sunlight from various sun positions comprises: a base solar cell chip having a primary surface and a backside surface opposite to the primary surface, the primary surface having at least one groove thereon; a vertical solar cell chip comprising two solar cell chips bonded together to form a double sided solar cell, the vertical solar cell chip having a first surface and a second surface that are n-type regions of the 3-D solar cell device, the second surface of the vertical solar cell chip being opposite to the first surface of the vertical solar cell chip, the vertical solar cell chip received in one of the at least one groove of the base solar cell chip to form a vertical plane with respect to a horizontal plane formed by the primary surface of the base solar cell chip; and a back solar cell chip coupled, to the base solar cell chip and the vertical solar cell chip, orthogonally with respect to the horizontal plane formed by the primary surface of the base solar cell chip and the vertical plane formed by the vertical solar cell chip, the back solar cell chip having a primary surface.

In one embodiment, the back solar cell chip comprises a monocrystalline silicon substrate.

In one embodiment, the back solar cell chip comprises a multi-junction III-V solar cell material.

In one embodiment, the horizontal plane formed by the primary surface of the base solar cell chip, the vertical plane formed by the vertical solar cell chip, and an orthogonal plane formed by the back solar cell chip intersect at right-angles with respect to each other to form a corner-cube configuration.

In one embodiment, two corner-cubes are formed by intersecting planes formed by the base solar cell chip, the vertical solar cell chip, and the back solar cell chip.

In one embodiment, the back solar cell chip has dimension approximately identical to dimensions of the base solar cell chip.

In one embodiment, the primary surface of the base solar cell chip, the first and second surfaces of the vertical solar cell chip, and the primary surface of the back solar cell chip are electrically connected to form an n-type region of the 3-D solar cell device.

In one embodiment, the backside surface of the base solar cell chip, a backside surface of the vertical solar chip, and a backside surface of the back solar cell chip are electrically connected to form a p-type region of the 3-D solar cell device.

In one embodiment, the 3-D solar cell device further comprises a block bonded to the backside surface of the base solar cell chip.

In one embodiment, the block comprises a metal heat-sink structure with a liquid cooling channel on or in the block.

In yet another aspect, a 3-D solar cell device for collecting sunlight from various sun positions comprises: a base solar cell chip containing at least one groove on its primary surface for holding another solar cell chip in a vertical direction; a vertical solar cell chip made by bonding two solar cell chips to form a double sided solar cell where its primary and secondary surface are n-type regions of a solar cell; an inversed T-shaped solar cell chip made by bonding the vertical solar cell chip into the groove of the base solar cell chip to form a vertical plane; two pieces of the inversed T-shaped solar cell chip bonded to a block where both backside of the primary surface of the base solar cell chip are facing down; a back solar cell chip made by bonding two solar cell chips to form a double sided solar cell where its primary and secondary surface are n-type regions of a solar cell; and a back solar cell chip attached orthogonally to the plane of both the base solar cell chip and the vertical solar cell chip to form four corner-cubes configuration.

In one embodiment, the primary surfaces of the base solar cell chip, the primary surface and the secondary surface of the vertical solar cell chip, and the primary surface and the secondary surface of the back solar cell chip are electrically connected to form an n-type region of the 3-D solar cell device.

In one embodiment, all backsides of the base solar cell chip, the vertical solar chip, and the back solar cell chip are electrically connected to form a p-type region of the 3-D solar cell device.

In one embodiment, the block comprises a metal heat-sink structure.

In one embodiment, the block comprises a metal heat-sink structure with a liquid cooling channel etched or machined on the block.

In a further aspect, a concentrated photovoltaic solar cell system, comprises: a 3-D solar cell device that comprises a base solar cell chip, a vertical solar cell chip, and a back solar cell chip; a dome structured focusing lens made by embedding a focusing lens on the inner surface of the dome; a liquid circulated to cool the 3-D solar cell while it is generating solar electricity; a hot-water system comprises a liquid pump, a heat-exchanger, and a water tank removing the heat from the liquid using the heat-exchanger for storing the heat into the water tank; and a power inverter to deliver solar electricity.

In one embodiment, the dome comprises a hemisphere shaped structure.

In one embodiment, the dome comprises an optical plastic material.

In one embodiment, the dome comprises an optical glass material.

In one embodiment, the dome comprises a metal frame holding the focusing lenses.

In one embodiment, the focusing lens comprises Fresnel lens.

In one embodiment, the focusing lens comprises a convex shaped lens.

In one embodiment, the focus lens has a form factor of a hexagonal and octagonal shape.

In one embodiment, the solar thermal energy from the liquid is recycled to warm up a hot-water tank.

In one embodiment, the solar cell system utilizes both solar thermal energy and solar electricity.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

In the following subsections, we provide details on the elements involved in the construction of the 3-D solar structure for a CPV solar device. Detailed assembly views are included in this section to assist in the understanding of the structural design and functionality of the 3-D solar cell and CPV solar device.

Illustrative First Example

Figure 1:
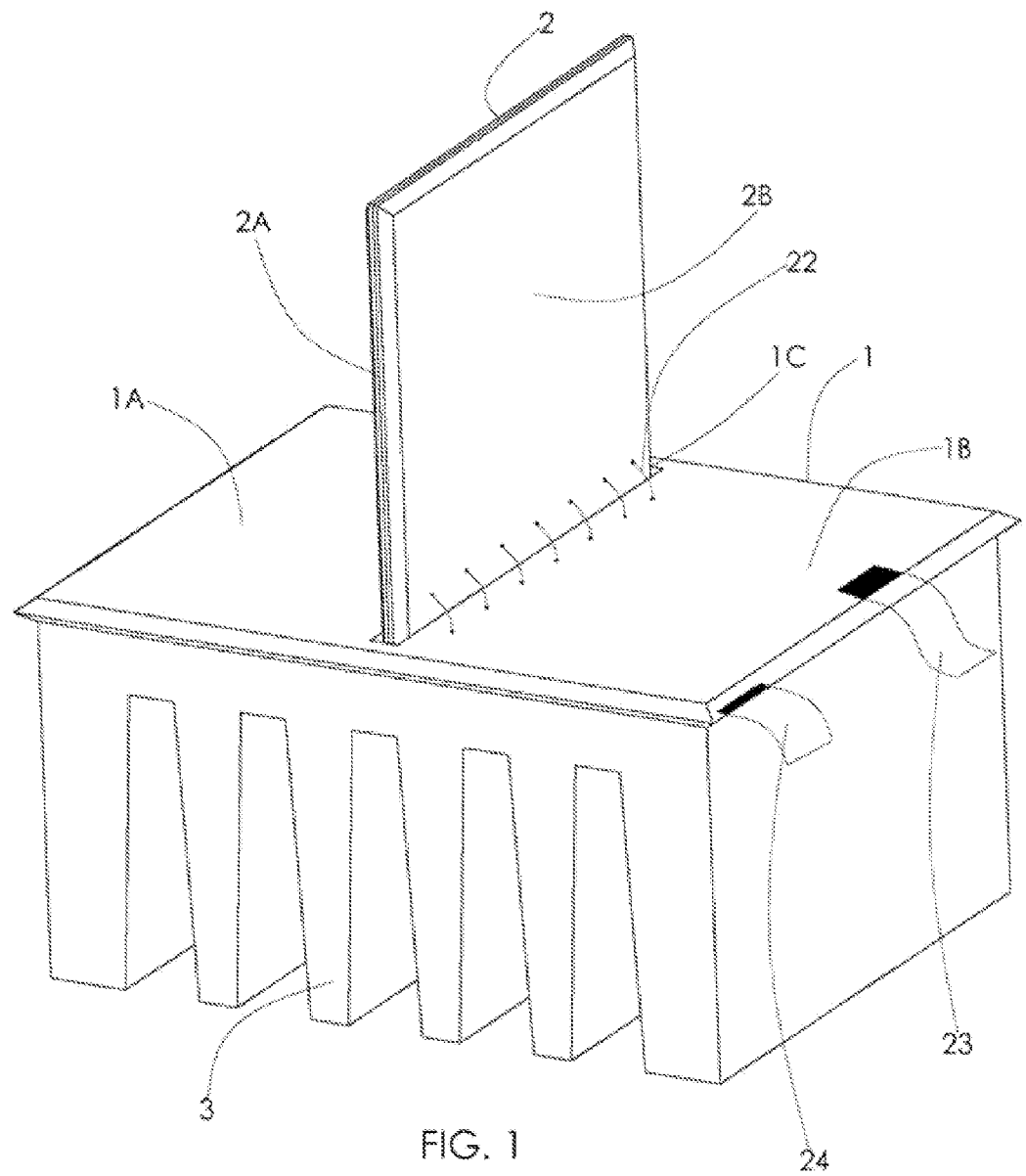
FIG. 1 shows an assembly view of a 3-D solar cell device with a metal-fin heat sink.

FIG. 1 shows an assembly view of a 3-D solar cell device. The 3-D solar cell structure comprises a base solar cell chip 1, a vertical solar cell chip 2 and a mounting block 3. The base solar cell chip 1 comprises a face of an n-type solar cell 1A and 1B, and a groove 10. The vertical solar cell chip 2 comprises a face of n-type solar cell 2A and a face of an n-type solar cell 2B. The vertical solar cell chip 2 can be formed by bonding two pieces of a solar cell back-to-back so that the n-type face of the vertical solar cell 2 shows on the n-type face of 2A and 2B. Then, the vertical solar cell chip 2 is interconnected to the groove 10 to form a perpendicular vertical wall shown in FIG. 1. The n-type faces 1A, 1B, 2A and 2B are connected by conducting wires 22 for an electrical connection on all n-type surfaces. Sunlight is focused by a lens element such as a convex or Fresnel lens to the faces of 1A, 1B, 2A and 2B as the sun travels from east to west. The n-type face 2A and 2B of the vertical solar cell chip 2 is a critical element for collecting all sunlight during the sunrise and sunset periods. The combined solar cell structure consisting of the base solar cell chip 1 and the vertical solar cell chip 2 is then mounted to the mounting block 3 for structural strength and heat sinking of the 3-D solar cell structure. The faces 1A, 1B, 2A and 2B of the solar cell chip 1 and 2 are electrically connected to collect all electricity that is generated by the focused sunlight impinging on its surfaces. All n-type surfaces of the solar cell are connected to a conductor 23 and all p-type surfaces of the solar cell are connected to a conductor 24.

Illustrative Second Example

Figure 2:
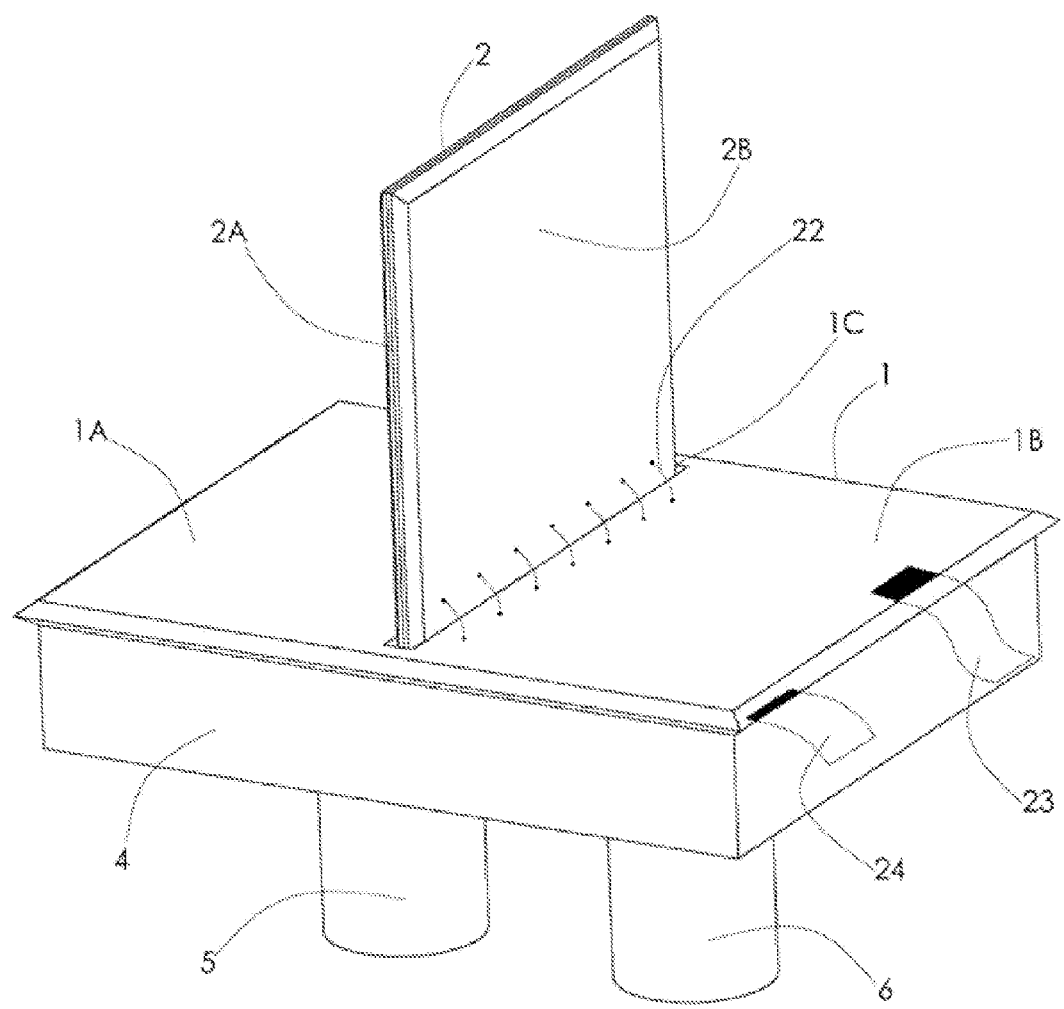
FIG. 2 shows an assembly view of a 3-D solar cell device with liquid cooling channel attached on the back of the solar cell.

FIG. 2 shows an assembly view of a 3-D solar cell device with liquid cooling channels attached on the backside of all solar cell surfaces. The 3-D solar cell structure comprises a base solar cell chip 1, a vertical solar cell chip 2, a mounting block 4, and an input and output port 5 and 6. All components in FIG. 2 are the same as those described in FIG. 1 of Section 6.1; however, the base solar cell chip 1 is designed with a liquid cooling channel that is etched on the backside of the base solar cell chips 1, or a separate liquid cooling channel is bonded to the backside of the solar cell chips 1. The vertical solar cell chip 2 is also formed by bonding a silicon chip with liquid cooling channels, or two pieces of the solar cell are bonded together on the p-type side where the solar chip is etched to form liquid cooling channels. Bonding of a liquid cooling channel on the solar cell chips 1 and 2 maintains the solar cell efficiency as increasing solar power density impinges on these surfaces. Depending on the cooling capacity of the liquid cooling channel, the solar cell can generate significant amount of electricity without any thermal breakdown or reduction in solar cell efficiency.

Illustrative Third Example

Figure 3:
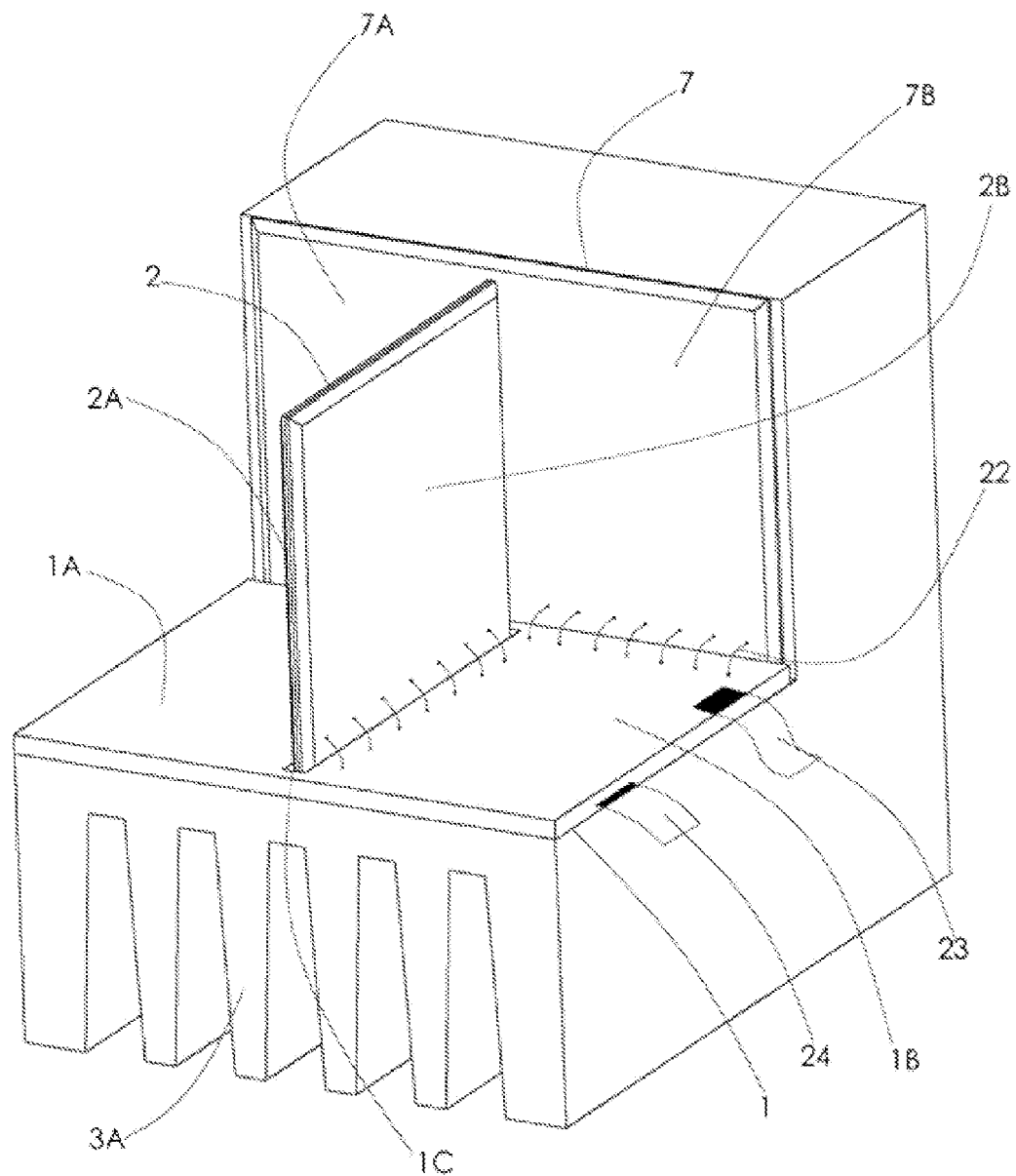
FIG. 3 shows an assembly view of a 3-D solar cell device with two corner-cube configuration mounted on a metal-fin heat sink.

FIG. 3 shows an assembly view of a 3-D solar cell device with two corner-cube configurations. The basic construction of the 3-D solar cell is the same as described in section 6.1; however, a back solar cell chip 7 is added to the solar cell chips 1 and 2 forming a perpendicular plane to these solar chips. The vertical solar cell chip 2 is added to collect all sunlight throughout daytime operations which eliminates the need of a sunlight tracking system. The detailed functionality of the vertical solar cell chip 2 will be described in a later section. In addition to the changing sun position during daily operations, the altitude of the sun position is also changed by seasonal changes and the solar cell has to track the sun position for maximum generation of solar electricity. To compensate for the seasonal position change, the back solar cell chip 7 is added to accommodate for the seasonal adjustment. Adding the vertical solar cell chip 2 and the back solar cell chip 7 allows all sunlight to be collected without moving the 3-D solar cell device. The 3-D solar cell device provides maximum solar cell efficiency without tracking the sun's position throughout the year.

Illustrative Fourth Example

Figure 4:
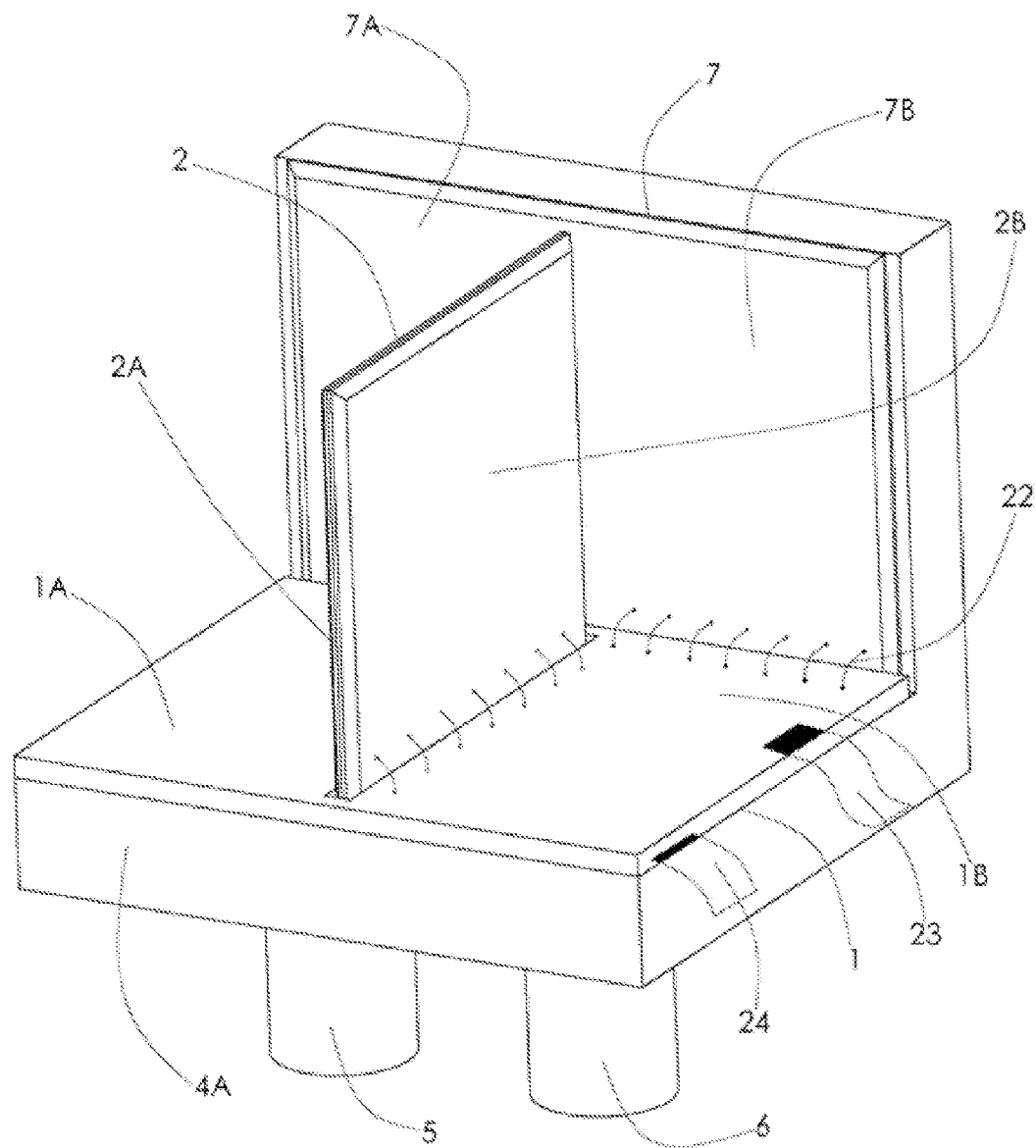
FIG. 4 shows an assembly view of a 3-D solar cell device with two corner-cube configuration mounted on liquid cooling block.

FIG. 4 shows an assembly view of a 3-D solar cell device with two corner-cube configuration attached to a liquid cooling channel. All base components are same as described in section 6.3; however, all n-type surfaces, 1A, 1B, 2A, 2B, 7A and 7B, are cooled by liquid cooling channels that are bonded onto the backside of these surfaces, or the liquid cooling channels are etched on the backside of the solar cell chips 1, 2 and 7 forming a liquid cooling channel. The mounting block 4A provide a structural holding fixture for the solar cell chips 1 and 7 and it has an input port 5 and output port 6. All n-type surfaces, 1A, 1B, 2A, 2B, 7A and 7B, are connected by conducting wires 22 and all n-type surfaces are connected to a conductor 23. All p-type surfaces are also soldered together for electrical continuity and all p-type surfaces are connected to conductor 24.

Illustrative Fifth Example

Figure 5:
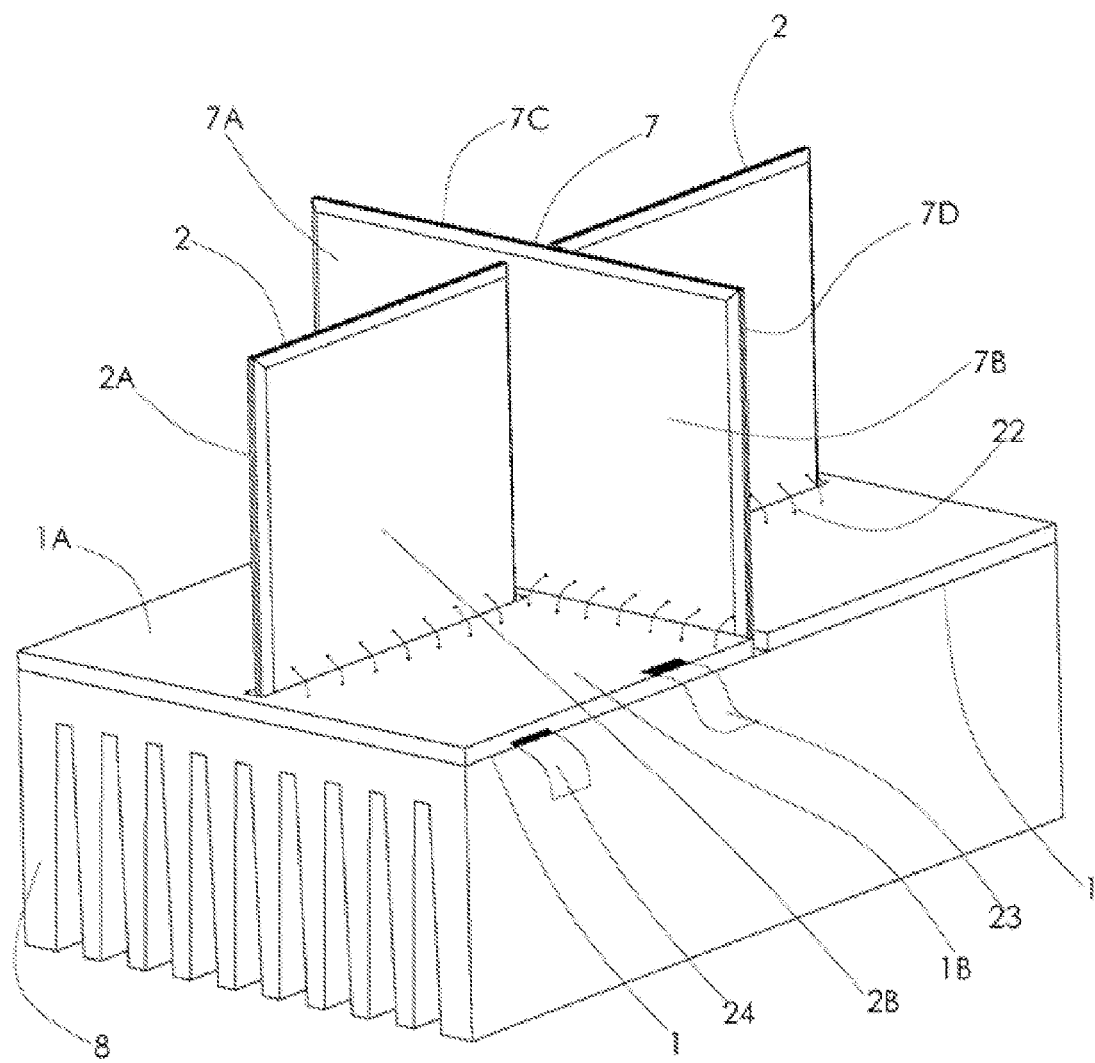
FIG. 5 shows an assembly view of a 3-D solar cell device with four corner-cube configuration mounted on a metal-fin heat sink.

FIG. 5 shows an assembly view of a 3-D solar cell device with four corner-cube configurations mounted on a heat sink. The 3-D solar cell structure comprises two base solar cell chips 1, two vertical solar cell chips 2, a back solar cell chip 7, and a mounting block 8. The solar chips 1, 2 and 7 are orthogonal to one another, forming a four corner-cube configuration as shown in FIG. 5. This configuration is needed to capture all sunlight from any latitude and longitude where the sun location changes dramatically during the day and during the year. This solar cell configuration captures all available sunlight without using a solar position tracking system. All n-type surfaces are connected by conducting wire 22 and all n-type surfaces are connected to a conductor 23. All p-type surfaces are also soldered together for electrical continuity and all p-type surfaces are connected to a conductor 24.

Illustrative Sixth Example

Figure 6:
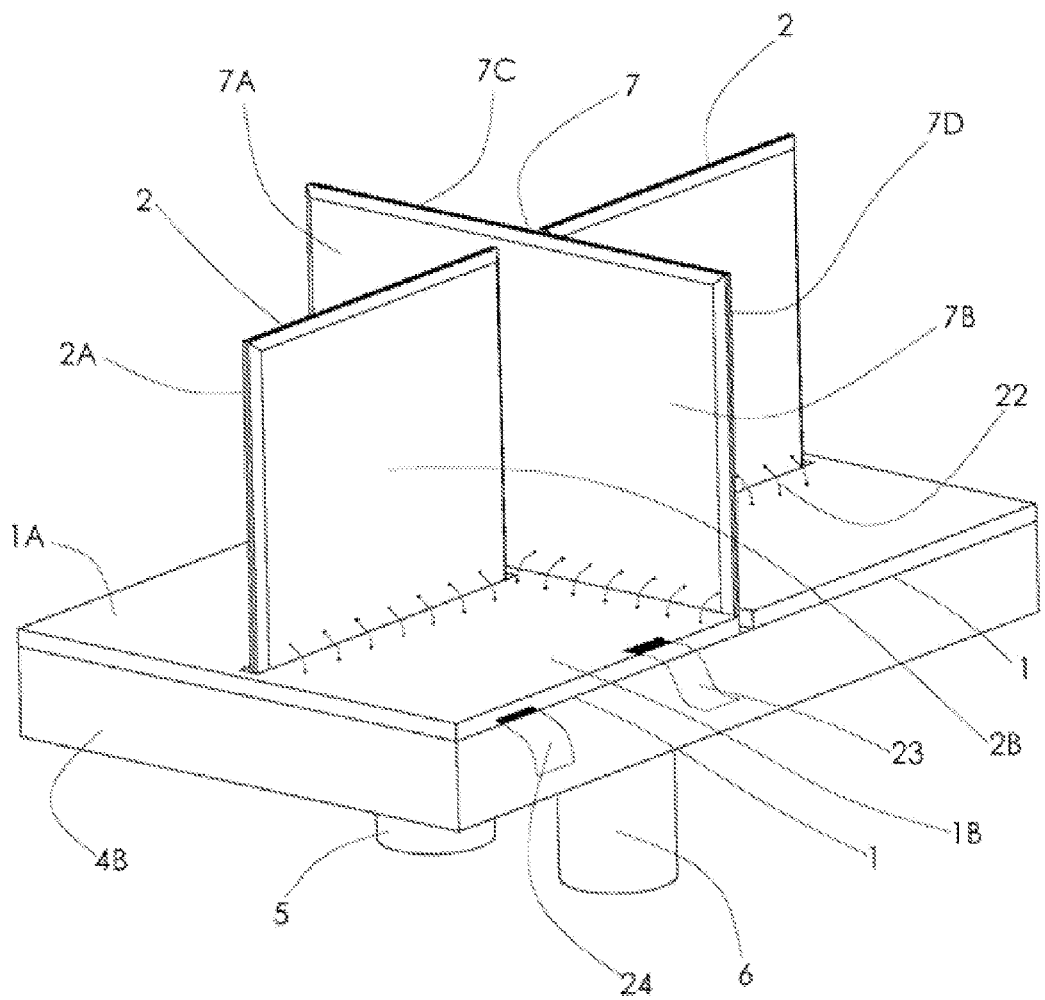
FIG. 6 shows an assembly view of a 3-D solar cell device with four corner-cube configuration mounted on a liquid cooling block.

FIG. 6 shows an assembly view of a 3-D solar cell device with a four corner-cube configuration attached to a liquid cooling channel. All base components are the same as those described in section 6.5; however, all n-type surfaces exposed to sunlight 1A, 1B, 2A, 2B, 7A, 7B, 7C and 7D are cooled by a liquid cooling channel that is either bonded or etched onto the backside of these surfaces. A mounting block 4B provides a structural holding fixture for the solar cell chips 1, 2 and 7, and it has an input port 5 and output port 6.

Illustrative First Implementation

Figure 7:
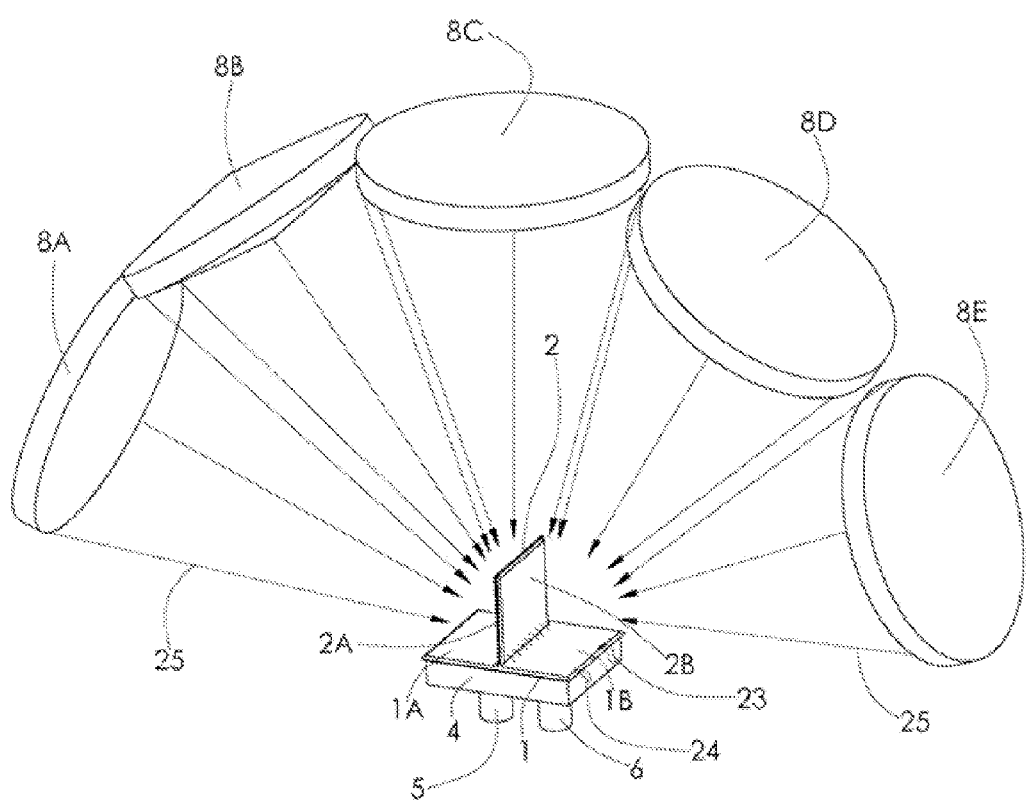
FIG. 7 shows an illustration view of the 3-D solar cell device working in various positions of daily solar movement.

FIG. 7 shows an illustrated view of how the 3-D solar cell device is working in various positions of the sun. The focusing lens 8A is placed in an early morning position and the focus spot of the sunlight 25 is projected onto the surface 2A of the vertical solar cell chip 2. The focusing lens 8B is placed in mid morning position and the focus spot of the sunlight 25 is projected onto a part of the surface 1A and 2A of the solar cell chip 1 and 2. The focusing lens 8C is placed in an afternoon position and the focus spot of the sunlight 25 is projected onto the surface 1A and 1B of the base solar cell chip 1. The focusing lens 8D is placed in a mid-afternoon position and the focus spot of the sunlight 25 is projected onto a part of the surface 1B and 2B of the solar cell chip 1 and 2. The focusing lens 8E is in placed in a late afternoon position and the focus spot of the sunlight 25 is projected onto the surface 2B of the vertical solar cell chip 2. The FIG. 7 demonstrates a concept of the 3-D solar cell device that can effectively collect all sunlight 25 throughout the day without tracking the sun position.

Illustrative Second Implementation

Figure 8:
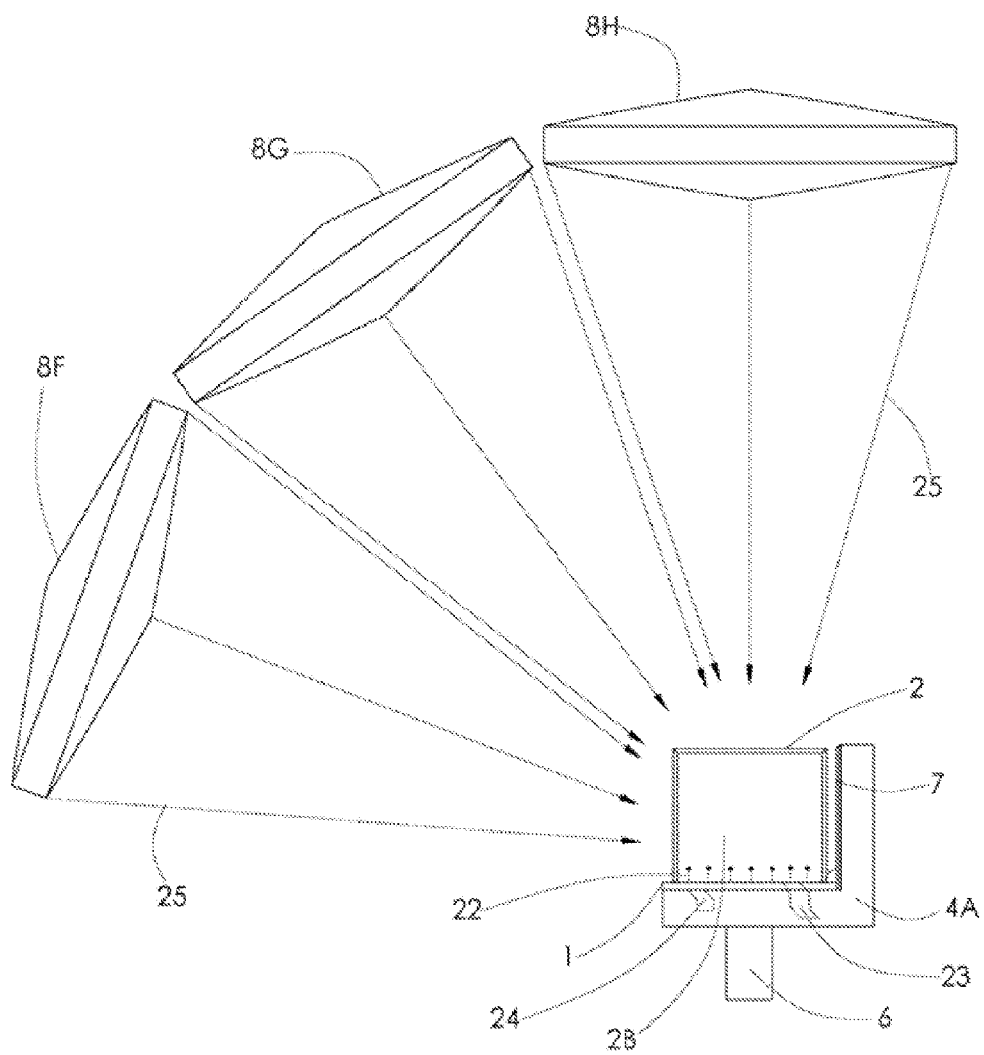
FIG. 8 shows an illustration view of the 3-D solar cell device working in various positions of seasonal solar movement.

FIG. 8 is another illustration of the 3-D solar cell device with two corner-cube configuration. As the Sun changes its altitude depending on each season, a solar cell has to move the position of the focusing spot normal to the Sun. The focusing lens 8F is in the position of the winter season for northern hemisphere and the focus spot of the sunlight 25 is projected mostly on the back solar cell chip 7. The focusing lens 8G is in the position of the spring and autumn seasons for the northern hemisphere and the focus spot of the sunlight 25 is projected onto a part of the base solar cell chip 1 and the back solar cell chip 7. The focusing lens 8H is in the position of the summer season for the northern hemisphere and the focus spot of the sunlight 25 is projected mostly on the base solar cell chip 1. This FIG. 8 shows the 3-D solar cell device can capture all sunlight from any solar position.

Illustrative Third Implementation

Figure 9:
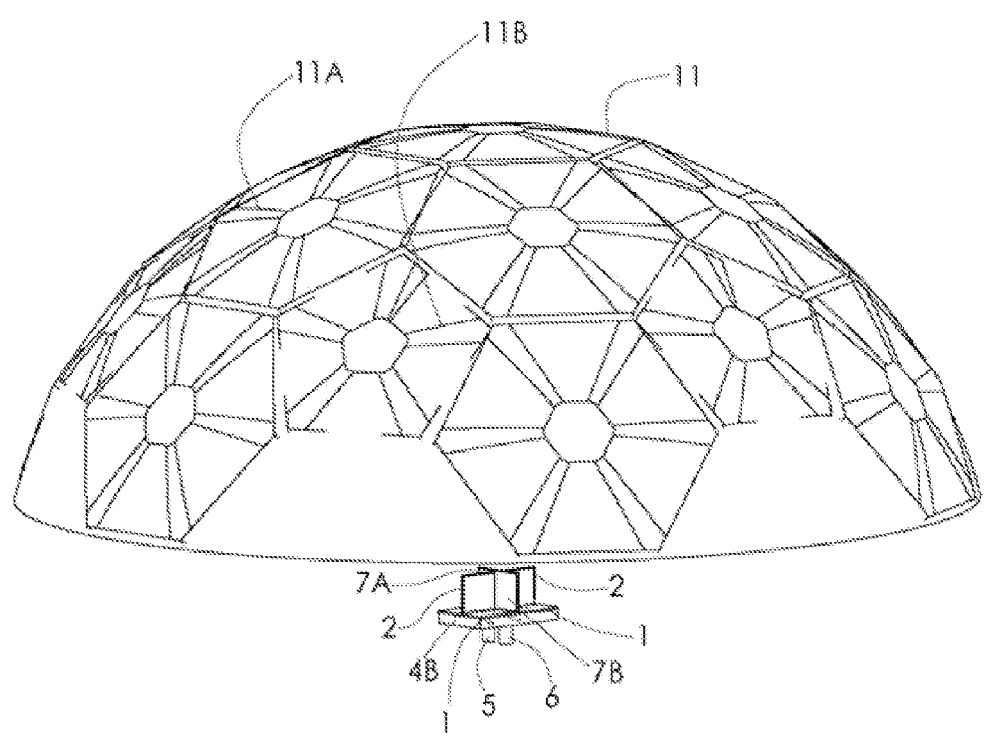
FIG. 9 shows a conceptual design of a CPV solar cell system using a 3-D solar cell device.

FIG. 9 is a conceptual design of a concentrated photovoltaic (CPV) solar cell system using a 3-D solar cell device. The advantage of the 3-D solar cell device is capturing all sunlight from any position of the Sun without tracking the Sun's movement. A dome 11 is constructed to hold focusing lenses 11A and 11B projecting a focus spot onto the 3-D solar cell device. The focusing lens 11A is designed to be a hexagonal shape and the focusing lens 11B is shaped like an octagon due to the geometric construction of the dome shape. The dome 11 can be constructed with glass or optical plastic and the focusing lenses 11A and 11B can be built with a convex or Fresnel lens. The 3-D solar cell device is placed at the center of the dome 11 where the focus spot is projected.

Illustrative Fourth Implementation

Figure 10:
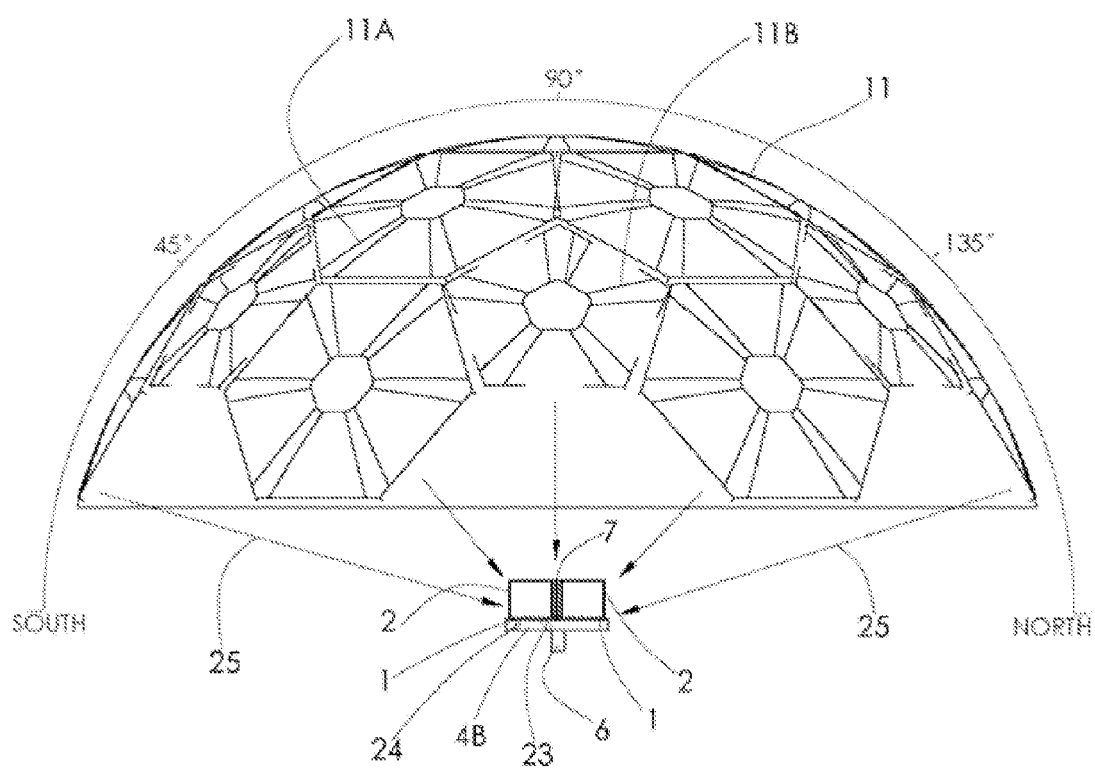
FIG. 10 shows an illustration view of a CPV solar cell system in seasonal solar tracking.

FIG. 10 shows an illustrated view of a concentrated photovoltaic (CPV) solar cell system performing seasonal solar tracking. The 3-D solar cell device with the four corner-cube configuration is placed at the center of the dome 11 and the angles of the dome 11 show various solar positions in different seasons. For instance, the Sun is at a 90° position during the summer season at the Equator and the sunlight 25 is projected onto the base solar cell chip 1; however, the solar altitude of North Pole is about 16° during the summer season and the sunlight 25 is mostly projected on the back solar cell chip 7. This figure demonstrates a visual projection of sunlight in various solar altitude positions onto the 3-D solar cell device. The 3-D solar cell device captures all sunlight efficiently without tracking the sun's movement during the season.

Illustrative Fifth Implementation

Figure 11:
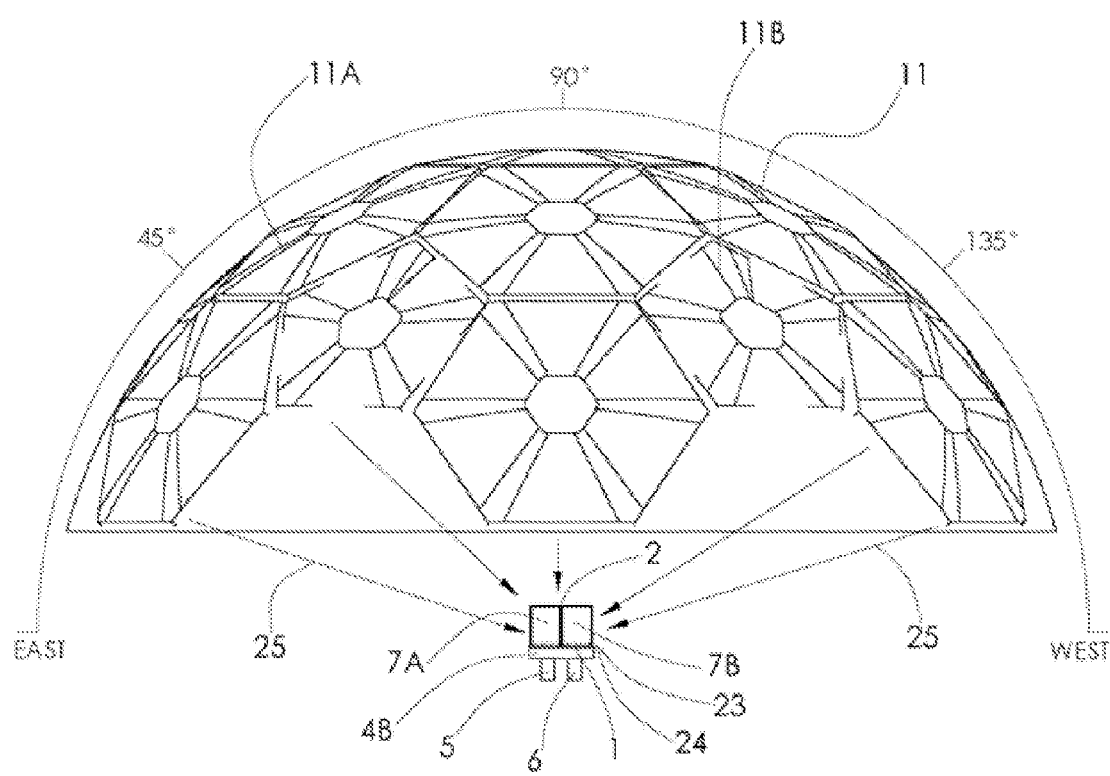
FIG. 11 shows an illustration view of a CPV solar cell system in daily solar tracking.

FIG. 11 shows an illustrated view of a concentrated photovoltaic (CPV) solar cell system performing daily solar tracking. The 3-D solar cell device with a four corner-cube configuration is placed at the center of the dome 11 and the angles of the dome 11 show various solar positions from sunrise to sunset. The sunrise position is set at 0° in the east position and the sunset position is set at 180° in the west position. The Sun is moving from east to west as the focused spot is also projected from the vertical solar cell chip 2 to the base solar cell chip 1 and back to the base solar cell chip 2 at sunset. This figure demonstrates a visual projection of sunlight captured by the 3-D solar cell device throughout the day and demonstrates its ability to capture all incident sunlight without using a solar tracking system.

Illustrative Sixth Implementation

Figure 12:
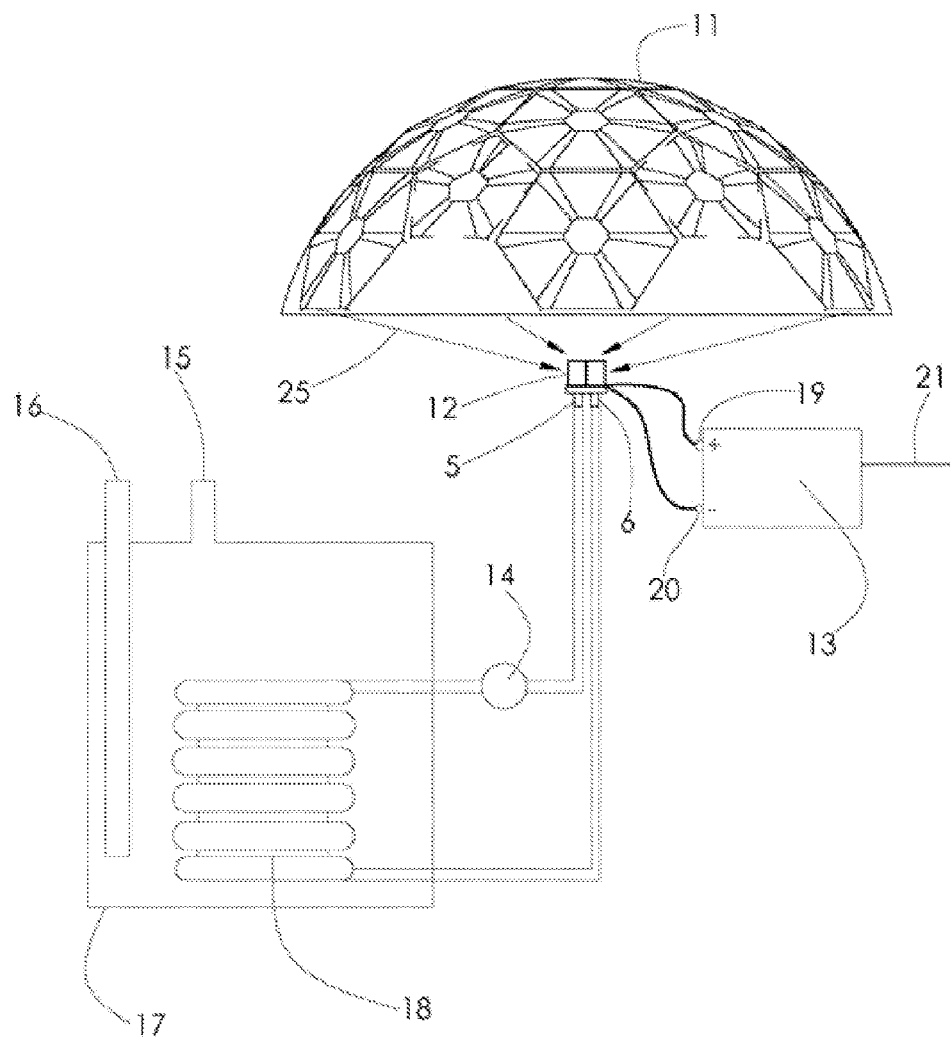
FIG. 12 shows a block diagram of a CPV solar cell system.

FIG. 12 shows a block diagram of a concentrated photovoltaic (CPV) solar cell system. The CPV solar cell system consists of a dome 11, a 3-D solar cell device 12, a liquid pump 14, a heat-exchanger 18, a water tank 17, and a solar power inverter 13. The cold liquid is pumped into an input liquid port 5 and the liquid temperature rises as it cools down the 3-D solar cell device 12, which is exposed to a high solar power density. The hot liquid is pumped out from the output port 6 after cooling down the 3-D solar cell device 12 and circulates to a heat-exchanger 18. The hot liquid is cooled down by the heat-exchanger 18 by releasing the energy into cold water that is stored in the water tank 17. The water tank 17 accumulates solar thermal energy from the hot liquid until it reaches a certain temperature, after which the water tank 17 circulates the warm water from the water tank 17 to a water output port 15 injecting cold water from a water input port 16. The warm water from the water output port 15 can be used for any hot-water application in household, or to heat up a room during cold weather.

The solar electricity generated by the 3-D solar cell device 12 can be connected to a power inverter 13 by connecting to a positive terminal port 19 and negative terminal port 20. The power inverter 13 converts the direct current (DC) from the 3-D solar cell device 12 into an alternating current (AC), and the AC is transported out to an AC terminal port 21. The AC is directly used in the household for any electrical application. The CPV solar cell system with the 3-D solar cell device utilizes both solar electricity and solar thermal energy and has significant advantage of lowering the cost of a CPV solar cell system.

CONCLUSION

The above-described techniques pertain to a 3-D solar cell device for concentrated photovoltaic system. Although the techniques have been described in language specific to certain applications, it is to be understood that the appended claims are not necessarily limited to the specific features or applications described herein. Rather, the specific features and applications are disclosed as exemplary forms of implementing such techniques. For instance, although the techniques have been described in the context of passive alignment of a laser diode, the techniques may be applied in any other suitable context.

What is claimed is:

1. A three-dimensional (3-D) solar cell device that collects sunlight from various sun positions, comprising:
  a base solar cell chip having a primary surface and a backside surface opposite to the primary surface, the primary surface having at least one groove thereon; and
  a vertical solar cell chip comprising two solar cell chips bonded together to form a double sided solar cell, wherein each of a first surface and a second surface of the vertical solar cell chip are n-type regions of the 3-D solar cell device, the second surface of the vertical solar cell chip being opposite to the first surface of the vertical solar cell chip,
  wherein the vertical solar cell chip is received in one of the at least one groove of the base solar cell chip to form a vertical plane with respect to a horizontal plane formed by the primary surface of the base solar cell chip.

2. The 3-D solar cell device of claim 1, wherein the base solar cell chip comprises a monocrystalline silicon substrate.

3. The 3-D solar cell device of claim 1, wherein the base solar cell chip comprises a multi-junction III-V solar cell material.

4. The 3-D solar cell device of claim 1, wherein the at least one groove comprises a V-groove or a rectangular channel.

5. The 3-D solar cell device of claim 1, wherein the vertical solar cell chip comprises a monocrystalline silicon substrate.

6. The 3-D solar cell device of claim 1, wherein the vertical solar cell chip comprises a multi-junction III-V solar cell material.

7. The 3-D solar cell device of claim 1, wherein the base solar cell chip is at least twice longer than the vertical solar cell chip in one dimension.

8. The 3-D solar cell device of claim 1, wherein the vertical solar cell chip is bonded orthogonally to the base solar cell chip.

9. The 3-D solar cell device of claim 1, wherein the primary surface of the base solar cell chip and the first surface of the vertical solar cell chip are electrically connected to form an n-type region in the 3-D solar cell device.

10. The 3-D solar cell device of claim 1, wherein the backside surface of the base solar cell chip and the second surface of the vertical solar chip are electrically connected to form a p-type region of the 3-D solar cell device.

11. The 3-D solar cell device of claim 1, further comprising a block bonded to the backside surface of the base solar cell chip.

12. The 3-D solar cell device of claim 11, wherein the block comprises a metal heat-sink structure with a liquid cooling channel on or in the block.

13. The 3-D solar cell device of claim 1, wherein the vertical solar cell chip is bonded to one of the at least one groove of the base solar cell chip by diffusion bonding, solder bonding, or epoxy bonding.

14. A three-dimensional (3-D) solar cell device that collects sunlight from various sun positions, comprising:
  a base solar cell chip having a primary surface and a backside surface opposite to the primary surface, the primary surface having at least one groove thereon;

a vertical solar cell chip comprising two solar cell chips bonded together to form a double sided solar cell, the vertical solar cell chip having a first surface and a second surface that are n-type regions of the 3-D solar cell device, the second surface of the vertical solar cell chip being opposite to the first surface of the vertical solar cell chip, the vertical solar cell chip received in one of the at least one groove of the base solar cell chip to form a vertical plane with respect to a horizontal plane formed by the primary surface of the base solar cell chip; and a back solar cell chip coupled, to the base solar cell chip and the vertical solar cell chip, orthogonally with respect to the horizontal plane formed by the primary surface of the base solar cell chip and the vertical plane formed by the vertical solar cell chip, the back solar cell chip having a primary surface.

15. The 3-D solar cell device of claim 14, wherein the back solar cell chip comprises a monocrystalline silicon substrate.

16. The 3-D solar cell device of claim 14, wherein the back solar cell chip comprises a multi-junction III-V solar cell material.

17. The 3-D solar cell device of claim 14, wherein the horizontal plane formed by the primary surface of the base solar cell chip, the vertical plane formed by the vertical solar cell chip, and an orthogonal plane formed by the back solar cell chip intersect at right-angles with respect to each other to form a corner-cube configuration.

18. The 3-D solar cell device of claim 14, wherein two corner-cubes are formed by intersecting planes formed by the base solar cell chip, the vertical solar cell chip, and the back solar cell chip.

19. The 3-D solar cell device of claim 14, wherein the back solar cell chip has dimension approximately identical to dimensions of the base solar cell chip.

20. The 3-D solar cell device of claim 14, wherein the primary surface of the base solar cell chip, the first and second surfaces of the vertical solar cell chip, and the primary surface of the back solar cell chip are electrically connected to form an n-type region of the 3-D solar cell device.

21. The 3-D solar cell device of claim 14, wherein the backside surface of the base solar cell chip, a backside surface of the vertical solar chip, and a backside surface of the back solar cell chip are electrically connected to form a p-type region of the 3-D solar cell device.

22. The 3-D solar cell device of claim 14, further comprising a block bonded to the backside surface of the base solar cell chip.

23. The 3-D solar cell device of claim 22, wherein the block comprises a metal heat-sink structure with a liquid cooling channel on or in the block.

* * * * *